United States Patent
Lee et al.

(10) Patent No.: US 7,289,149 B1
(45) Date of Patent: Oct. 30, 2007

(54) OPERATIONAL TRANSCONDUCTANCE AMPLIFIER FOR HIGH-SPEED, LOW-POWER IMAGING APPLICATIONS

(75) Inventors: Hae-Seung Lee, Bedford, MA (US); Keith Glen Fife, Stanford, CA (US)

(73) Assignee: Sensata Technologies, Inc., Attleboro, MA (US)

( * ) Notice: Subject to any disclaimer, the term of this patent is extended or adjusted under 35 U.S.C. 154(b) by 1103 days.

(21) Appl. No.: 10/400,731

(22) Filed: Mar. 27, 2003

Related U.S. Application Data (60) Provisional application No. 60/368,904, filed on Mar. 29, 2002.

(51) Int. Cl.
 *H04N 5/235* (2006.01)
 *H04N 5/228* (2006.01)
 *H04N 3/14* (2006.01)
 *H04N 5/335* (2006.01)

(52) U.S. Cl. .................. 348/300; 348/301; 348/222.1; 348/229.1

(58) Field of Classification Search ................ 348/300, 348/301, 229.1
See application file for complete search history.

(56) References Cited

U.S. PATENT DOCUMENTS

| 4,466,018 | A | * | 8/1984 | Soneda et al. .............. 348/300 |
|---|---|---|---|---|
| 4,783,602 | A | | 11/1988 | Viswanathan |
| 5,541,555 | A | | 7/1996 | Pernici |
| 5,602,509 | A | | 2/1997 | Kimura |
| 5,815,039 | A | | 9/1998 | Kimura |
| 5,855,268 | A | | 1/1999 | Zoladz, Jr. |
| 5,892,540 | A | * | 4/1999 | Kozlowski et al. ......... 348/300 |
| 5,969,545 | A | | 10/1999 | Assadian et al. |
| 5,977,760 | A | | 11/1999 | Kimura |
| 5,999,055 | A | | 12/1999 | Kimura |
| 6,008,667 | A | | 12/1999 | Fahrenbruch |
| 6,493,030 | B1 | * | 12/2002 | Kozlowski et al. ......... 348/310 |
| 6,587,142 | B1 | * | 7/2003 | Kozlowski et al. ......... 348/241 |
| 6,777,660 | B1 | * | 8/2004 | Lee .......................... 250/206.1 |

FOREIGN PATENT DOCUMENTS

WO    WO 01/73742    10/2001

* cited by examiner

*Primary Examiner*—Lin Ye
*Assistant Examiner*—Richard M Bemben
(74) *Attorney, Agent, or Firm*—Russell E. Baumann (57) ABSTRACT

A low power imaging array has a plurality of pixels wherein each pixel converts an intensity of incident light into electrical energy. An operational transconductance amplifier is utilized in conjunction with the imaging array to process the image signals from the low power imaging array. The operational transconductance amplifier includes a current mirror stage with a current mirror gain factor. The current mirror gain factor is selected based on a pixel noise level introduced by the low power imaging array such that current mirror gain factor noise introduced by the current mirror gain factor results in an overall noise level that is less than or equal to a predetermined level.

35 Claims, 4 Drawing Sheets

PRIOR ART

OPERATIONAL TRANSCONDUCTANCE AMPLIFIER FOR HIGH-SPEED, LOW-POWER IMAGING APPLICATIONS

CROSS-REFERENCE TO RELATED PROVISIONAL APPLICATION

The present patent application claims priority under 35 U.S.C. § 119 from U.S. Provisional Patent Application Ser. No. 60/368,904 filed on Mar. 29, 2002. The entire contents of U.S. Provisional Patent Application Ser. No. 60/368,904 filed on Mar. 29, 2002 are hereby incorporated by reference.

FIELD OF THE PRESENT INVENTION

The present invention relates generally to an operational transconductance amplifier for imaging applications such as that of a MOS imaging array. More particularly, the present invention is directed to an operational transconductance amplifier for imaging applications such as that of a MOS imaging array wherein low power operation and sufficient operational speed are realized by adjustment of the amplifier's transconductance through a gain factor that is selected based on a noise characteristic of a given imaging array.

BACKGROUND OF THE PRESENT INVENTION

Conventionally, MOS image sensors have been used in imaging applications, such as still photography and video imaging products. One reason for the utilization of MOS imaging products is the MOS image sensors' compatibility with VLSI circuit design and fabrication processing.

Since low-cost, large-scale MOS design and fabrication technologies that have been developed for large-volume VLSI circuits can be directly employed in the production of MOS imaging arrays, MOS imaging arrays are, in general, much more cost effective than imaging arrays produced based on CCD technologies. As a result, for many applications, and particularly for consumer products, a MOS imaging array is preferred over a corresponding CCD imaging array.

Another factor in utilizing MOS imaging arrays over CCD technology imaging arrays is their ability to operate at high speeds and low powers. Typically, power consumption of MOS imagers is dominated by amplifiers used in correlated double sampling (CDS) circuits and A/D converters. Therefore, in a low power MOS imaging array, it is critical to provide amplifiers that can properly operate at the lower power restraints.

One possible solution to the power constraints of a low power high speed MOS imaging array is the utilization of a conventional operational transconductance amplifier in the analog signal processing circuits.

Figure 4:
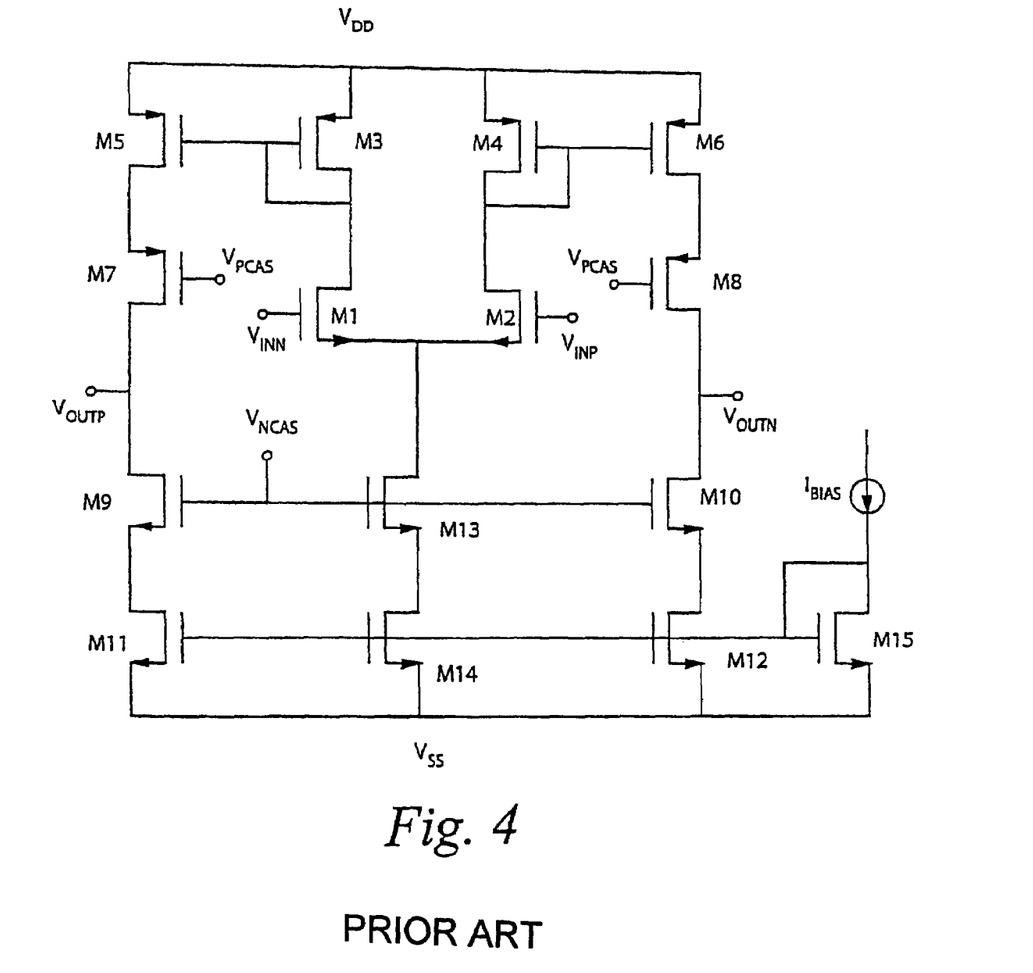
FIG. 4 is an illustration of a detail schematic of a conventional operational transconductance amplifier.

A conventional operational transconductance amplifier circuit is depicted in FIG. 4. Although a fully-differential version of an operational transconductance amplifier circuit is shown, implementation of a single-ended version is straightforward. For the simplicity of illustration, a common-mode feedback circuit that is often required in a fully-differential amplifier is omitted.

M1 and M2 comprise the input differential pair. A cascode current source provided by M13 and M14 serves as a tail current source for a differential input stage consisting of M1, M2, M3, and M4. An input voltage is applied differentially at nodes labeled $V_{INP}$ and $V_{INN}$. Differential outputs are obtained at nodes labeled $V_{OUTP}$ and $V_{OUTN}$.

The currents through the input transistors M1 and M2 are mirrored by a first current mirror, M3 and M5, and a second current mirror, M4 and M6, respectively. The mirrored currents go through cascode stages M7 and M8 and show up at the output nodes $V_{OUTP}$ and $V_{OUTN}$.

The cascode stages are employed in order to increase the output resistance. The cascode current sources with high output resistance, provided by M9, M10, M11, and M12, complete the output stage.

$I_{BIAS}$ and M15 set up the gate voltages for M11, M12, and M14 fixing their currents. Nominally, the width of M14 is twice the width of M11 or M12.

It can be shown that this arrangement makes the nominal drain currents of M1 and M2 equal to those of M11 and M12, a necessary condition for both the input and the output stages to have the same bias current level.

Although a conventional operational transconductance amplifier, as illustrated in FIG. 4, may meet the power constraints mentioned above, it is also well known that the current mirror gain factor of the operational transconductance amplifier typically increases the noise level in the output signal of an operational transconductance amplifier. Substantial noise increase is undesirable in a MOS imaging system because the quality of images from the MOS imaging array is highly sensitive to noise.

Therefore, it is desirable to provide analog signal processing circuits that operate effectively under the low power conditions. Moreover, it is desirable to provide amplification in the analog signal processing circuitry without introducing substantial increase in noise that would detrimentally affect the quality of images from the MOS imaging array. Furthermore, it is desirable to provide an amplifier that has the low power characteristics without introducing substantial increase of noise into the MOS imaging array signal.

SUMMARY OF THE PRESENT INVENTION

A first aspect of the present invention is directed to an imaging apparatus. The imaging apparatus includes an imaging array having a plurality of pixels, the pixels converting an intensity of incident light into electrical energy, and an operational transconductance amplifier operatively connected to the imaging array. The operational transconductance amplifier includes a current mirror stage with a current mirror gain factor. The current mirror gain factor is selected based on a pixel noise level introduced by the imaging array such that noise introduced by the current mirror gain factor results in an overall noise level that is less than or equal to a predetermined level.

A second aspect of the present invention is directed to an imaging apparatus. The imaging apparatus includes an imaging array having a plurality of pixels, the pixels converting an intensity of incident light into electrical energy; a correlated double sampling circuit operatively connected to the imaging array; and an analog to digital converter circuit operatively connected to the correlated double sampling circuit. The correlated double sampling circuit includes an operational transconductance amplifier having a current mirror stage with a current mirror gain factor. The current mirror gain factor is selected based on a pixel noise level introduced by the imaging array such that noise introduced by the current mirror gain factor results in an overall noise level that is less than or equal to a predetermined level.

A third aspect of the present invention is directed to an imaging apparatus. The imaging apparatus includes an imaging array having a plurality of pixels and a plurality of columns, each pixel converting an intensity of incident light into electrical energy, the plurality of pixels being arranged such a predetermined of pixels are associated with a column of the imaging array; a plurality of correlated double sampling circuits, the plurality of correlated double sampling circuits being arranged such that each column of the imaging array is operatively connected to a correlated double sampling circuit; and a plurality of analog to digital converter circuits, the plurality of analog to digital converter circuits being arranged such that two correlated double sampling circuits are operatively connected to one analog to digital converter circuit. Each correlated double sampling circuit includes an operational transconductance amplifier having a current mirror stage with a current mirror gain factor. The current mirror gain factor is selected based on a pixel noise level introduced by the imaging array such that noise introduced by the current mirror gain factor results in an overall noise level that is less than or equal to a predetermined level.

A fourth aspect of the present invention is directed to an imaging apparatus. The imaging apparatus includes an imaging array having a plurality of pixels and a plurality of rows, each pixel converting an intensity of incident light into electrical energy, the plurality of pixels being arranged such a predetermined of pixels are associated with a row of the imaging array; a plurality of correlated double sampling circuits, the plurality of correlated double sampling circuits being arranged such that each row of the imaging array is operatively connected to a correlated double sampling circuit; and a plurality of analog to digital converter circuits, the plurality of analog to digital converter circuits being arranged such that two correlated double sampling circuits are operatively connected to one analog to digital converter circuit. Each correlated double sampling circuit includes an operational transconductance amplifier having a current mirror stage with a current mirror gain factor. The current mirror gain factor is selected based on a pixel noise level introduced by the imaging array such that noise introduced by the current mirror gain factor results in an overall noise level that is less than or equal to a predetermined level.

A fifth aspect of the present invention is directed to an imaging apparatus. The imaging apparatus includes an imaging array having a plurality of pixels, the pixels converting an intensity of incident light into electrical energy; a correlated double sampling circuit operatively connected to the imaging array; and an analog to digital converter circuit operatively connected to the correlated double sampling circuit. The analog to digital converter circuit includes an operational transconductance amplifier having a current mirror stage with a current mirror gain factor. The current mirror gain factor is selected based on a pixel noise level introduced by the imaging array such that noise introduced by the current mirror gain factor results in an overall noise level that is less than or equal to a predetermined level.

BRIEF DESCRIPTION OF THE DRAWINGS

The present invention may take form in various components and arrangements of components, and in various steps and arrangements of steps. The drawings are only for purposes of illustrating a preferred embodiment or embodiments and are not to be construed as limiting the present invention, wherein.

DETAILED DESCRIPTION OF THE PRESENT INVENTION

The present invention will be described in connection with specific embodiments; however, it will be understood that there is no intent to limit the present invention to the embodiments described herein. On the contrary, the intent is to cover all alternatives, modifications, and equivalents as may be included within the spirit and scope of the present invention as defined by the appended claims.

For a general understanding of the present invention, reference is made to the drawings. In the drawings, like reference have been used throughout to designate identical or equivalent elements. It is also noted that the various drawings illustrating the present invention are not drawn to scale and that certain regions have been purposely drawn disproportionately so that the features and concepts of the present invention could be properly illustrated.

Figure 1:
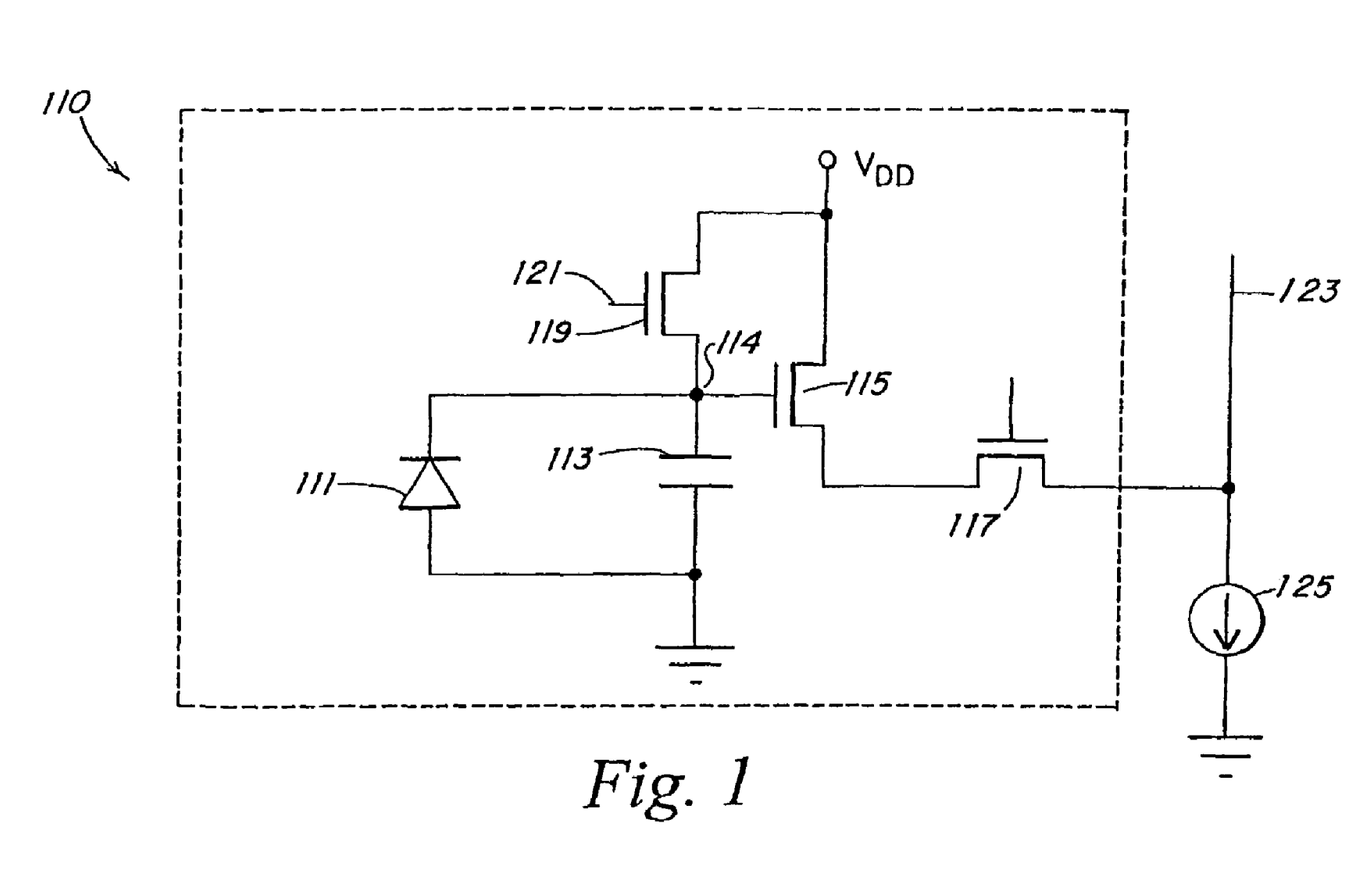
FIG. 1 illustrates a schematic diagram of a pixel.

FIG. 1 illustrates the components within a pixel of an imaging array used to convert light into electrical energy according to the concepts of the present invention. Referring to FIG. 1, the operation of an active pixel 100 will be described. The example pixel configuration, as illustrated in FIG. 1, employs a photodiode 111, but it is to be recognized that in general, the pixel can include other light collecting configurations, embodied as, e.g., a phototransistor, a photogate, or other selected configuration. In the current example, a photodiode 111 of the pixel 100 produces a current of photogenerated electrical charge in response to illumination intensity incident on the photodiode. The resulting photocurrent causes charge associated with a capacitor 113 of the photodiode 111 to dissipate in proportion to the incident illumination intensity. As an electrical element, the sense capacitor 113 physically is provided as the parasitic reverse-biased P-N junction capacitance associated with the photodiode itself and other parasitic capacitance.

A transistor 115 operates as a source follower that buffers the voltage of the photodiode capacitor 113, at a sense node 114 of the capacitor, nondestructively to a column line 123 for read out of the pixel voltage. A row select switch 117 activates the source follower transistor 115 when the particular row of an imaging array in which the pixel resides is selected to thereby enable the sense capacitor voltage measurement. When the row select switch 117 of the row is turned ON, and a current source 125 is connected to the source of the transistor 115, the transistor 115 and the current source 25 operate as a source-follower configuration to buffer the voltage of the sense capacitor sense node 114 to the column line 123 for determining the capacitor voltage at the end of an exposure period, thereby to measure the electronic charge held by the pixel.

The voltage from the column line 123 is fed to a correlated double sampling circuit that double-samples the pixel output. The sampling of the pixel output at different times; e.g., during a pixel reset period and then again during an integration period; is a well-known technique often employed for correcting for the fixed pattern noise caused by MOS transistor threshold voltage mismatch. This technique enables a determination and cancellation of the extent of a pixel output that is due to fixed pattern noise.

It is noted that the concepts described above are equally applicable to an imaging array that utilizes a row line to read out the pixel and a column select switch to activate the source follower transistor when the particular column of an imaging array in which the pixel resides is selected to thereby enable the sense capacitor voltage measurement.

Figure 2:
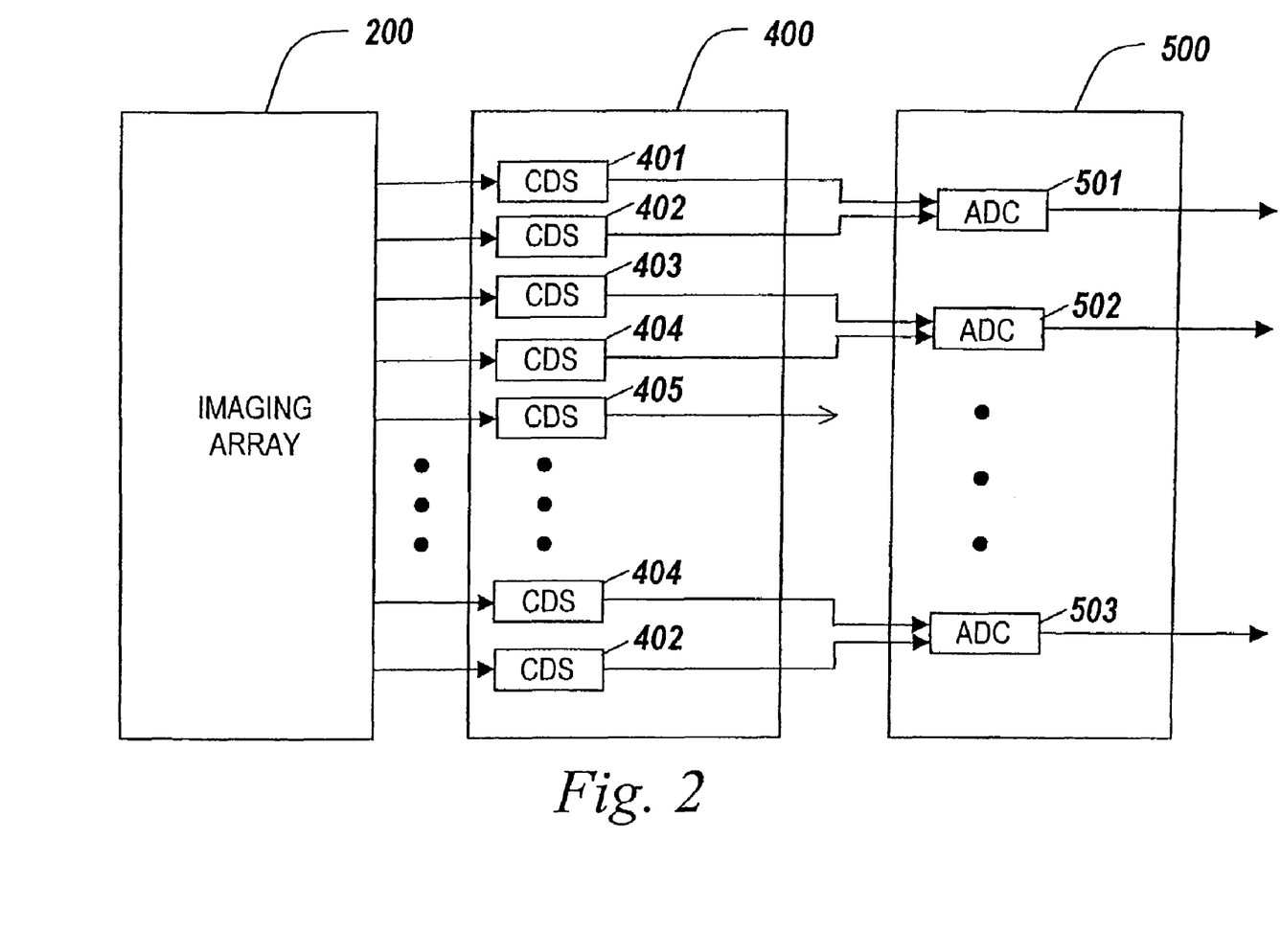
FIG. 2 is a block diagram of an imaging apparatus according to the concepts of the present invention.

FIG. 2 illustrates a block diagram of an imaging apparatus according to the concepts of the present invention. As shown in FIG. 2, an imaging array 200 is constructed of a plurality of pixels, such as described above with respect to FIG. 1, such that each pixel converts light intensity corresponding to incident light into electrical energy. In a preferred embodiment of the present invention, the imaging array 200 is a MOS imaging array.

The imaging array 200 is connected to an array or plurality of correlated double sampling circuits 400 that provides the double-sampling functionality for the pixel output. The array of correlated double sampling circuits 400 is connected to an array or plurality of analog to digital converters 500 that provides the functionality of converting the analog signals to digital signals.

According to the concepts of the present invention, a separate correlated double sampling circuit is provided for each column or each row of the imaging array 200, depending upon the actual configuration of the imaging array 200.

More specifically, as illustrated in FIG. 2, each correlated double sampling circuit (401, 402, 403, 404, 405 . . . 40Y, and 40Z) is connected to a single column of the imaging array 200 so that each correlated double sampling circuit double-samples the pixel output voltage from a single column.

Again, it is noted that the concepts described above are equally applicable to an imaging array that utilizes a row line to read out the pixel and a column select switch to activate the source follower transistor when the particular column of an imaging array in which the pixel resides is selected to thereby enable the sense capacitor voltage measurement, and thus, in this variation, each correlated double sampling circuit would be connected to a single row of the imaging array 200.

Furthermore, according to the concepts of the present invention, the outputs from two correlated double sampling circuits are fed to a single analog to digital converter circuit that converts the analog signals into digital signals. More specifically, as illustrated in FIG. 2, two correlated double sampling circuits 401 and 402 are connected to a single analog to digital converter circuit 501; two correlated double sampling circuits 403 and 404 are connected to a single analog to digital converter circuit 502; and two correlated double sampling circuits 40Y and 40Z are connected to a single analog to digital converter circuit 50Z.

It is noted that in a preferred embodiment of the present invention, each correlated double sampling circuit includes an operational transconductance amplifier, and each analog to digital converter circuit includes at least one operational transconductance amplifier.

As noted above, the present invention provides an operational transconductance amplifier that enables low power operation while providing an operational speed that is sufficient for imaging applications such as that of a MOS imaging array. As explained in detail below, the operational speed and power performance of the operational transconductance amplifier is achieved by adjustment of the amplifier's transconductance through a gain factor that is selected based on a level of noise characteristic of a given imaging array.

Figure 3:
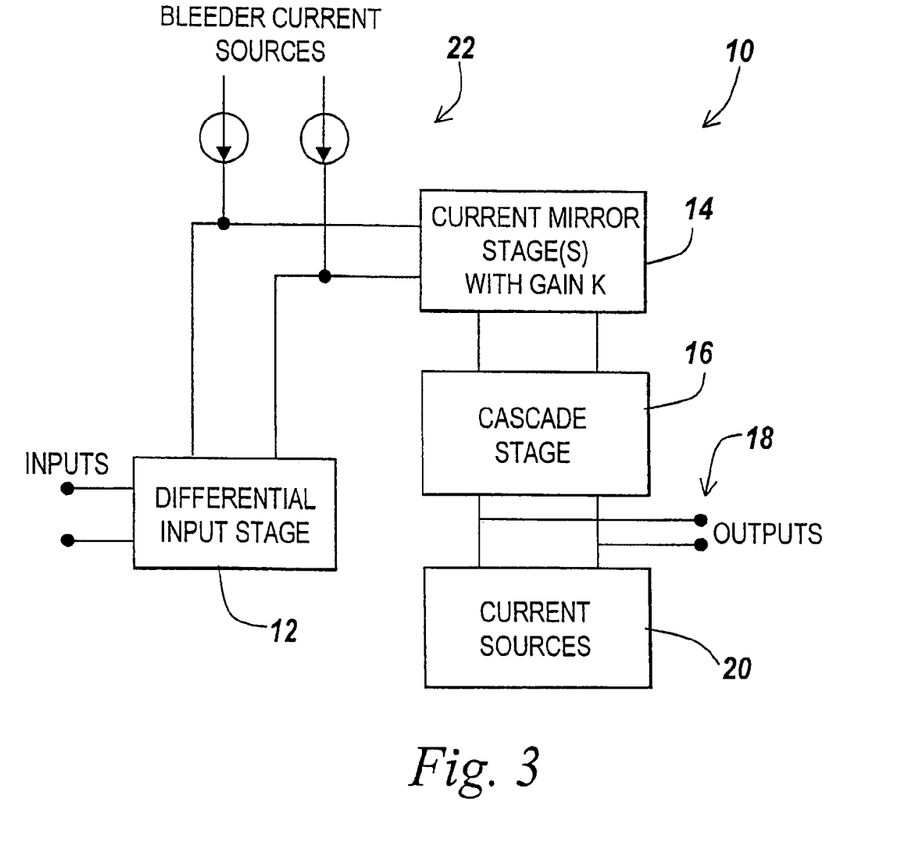
FIG. 3 is a block diagram of an operational transconductance amplifier according to the concepts of the present invention.

FIG. 3 is a block diagram of an operational transconductance amplifier 10 in accordance with the concepts of the present invention. This operational transconductance amplifier 10, in a preferred embodiment of the present invention, is included in a correlated double sampling circuit and in an A/D converter circuit.

A preferred embodiment of operational transconductance amplifier 10 includes a differential input stage 12, operatively connected to an imaging device (not shown), preferably a MOS imaging array, to receive image signals therefrom; a current mirror stage or stages 14, having a selected gain factor, K; a cascode stage 16; outputs 18; current sources 20; and bleeder current sources 22. It is noted that the cascode stage 16 and the bleeder current sources 22 are optional components of the operational transconductance amplifier and are not necessary to the basic concepts of the present invention.

In a preferred embodiment of the present invention, the differential input stage 12 of the operational transconductance amplifier 10 receives differential input voltages and the cascode sections 16 provide differential output currents.

It is further noted that a start-up circuit stage can be included to increase the robustness of the operational transconductance amplifier 10. Specifically, the start-up stage can be included to prevent a so-called stuck-state condition of inoperability that could result due to the fully differential configuration of the operational transconductance amplifier 10.

As with conventional operational transconductance amplifiers, the current mirror stage 14 consists of a plurality of transistors, preferably MOS transistors. The transistors of the current mirror stage 14 are designed with channel lengths and widths that are specifically selected to produce a corresponding current mirror gain factor. The gain factor results in increased bandwidth and reduced power requirements of the operational transconductance amplifier 10.

In accordance with the concepts of the present invention, the gain factor is selected based on the level of noise to be accommodated by an imaging application for which a MOS imaging array including the operational transconductance amplifier of the present invention is employed.

Moreover, contrary to conventional wisdom, the present invention provides a viable solution with respect to the utilization of operational transconductance amplifiers with current gain with MOS imaging applications so that the benefits of utilizing an operational transconductance amplifier with MOS imaging array applications can be realized without experiencing operational degradation, the noise corresponding to the current mirror stage gain factor.

Specifically, the present invention provides an operational transconductance amplifier, which is regulated so that noise associated with a current mirror gain factor is substantially less than the noise associated with other MOS imaging array pixel noise sources such as reset noise. By regulating the gain factor of the current mirror of the operational transconductance amplifier, the bandwidth and power benefits of an operational transconductance amplifier can be realized without substantial degradation of MOS imaging array performance parameters.

To further illustrate the concepts of the present invention with respect to the realization of bandwidth and power benefits of an operational transconductance amplifier without degradation of MOS imaging array performance parameters, an example of a preferred technique for selecting the operational transconductance amplifier mirror stage gain factor for a MOS imaging array application will be discussed below.

When, according to a preferred embodiment of the present invention, selecting the operational transconductance amplifier mirror stage gain factor for a MOS imaging array application, the noise of each operational transconductance amplifier stage is first analyzed as a function of the mirror stage gain factor.

For example, considering the operational transconductance amplifier input stage 12, the noise, $N_I$, from the input stage 12 of the operational transconductance amplifier 10 is given as a function of spectral density, SD, and bandwidth, BW, as:

$$(N_1)^2 = SD*BW$$

Assuming that the input transistors, in the input differential stage, dominate the noise spectral density of the operational transconductance amplifier, the operational transconductance amplifier spectral density is given as:

$$SD = ((4kT)/((3/2)(g_m)))*2 \text{ input state transistors} = (16kT)/(3g_m)$$

where $g_m$ is the transconductance of each input stage transistor. It is noted that in a typical operational transconductance amplifier design, transistors other than the input stage transistors also contribute non-negligible noise, making the spectral density larger. However, it is found that the noise analysis here is not affected by the increased noise from other transistors, which can therefore be ignored.

The operational transconductance amplifier bandwidth, BW, is given as:

$$BW = (1/2\pi)(G_m/C_L)$$

where $G_m$ is the overall transconductance of the operational transconductance amplifier, and $C_L$ is the total capacitive load of the operational transconductance amplifier.

In turn, the operational transconductance amplifier's transconductance, $G_m$, is a function of the input transconductance, as:

$$G_m = Kg_m$$

where K is the gain selected for the mirror stage of the operational transconductance amplifier.

Thus, the overall transconductance of the operational transconductance amplifier is directly amplified by the current mirror gain factor K. As a result, the bandwidth is correspondingly increased by the current mirror gain factor.

With these relationships, the operational transconductance amplifier input stage mean-square noise can be analyzed as:

$$(N_1)^2 = (1/2\pi)(16/3)(kTK/C_L)$$

From this equation and the others set forth above, it is found that as the gain, K, of the mirror stage is increased, the bandwidth, BW, is increased and the operational transconductance amplifier power can be reduced even with the same operational speed, given that the transistors are biased in weak inversion and the transistor current is proportional to the input transconductance. However, with these benefits, the mean-square noise of the operational transconductance amplifier is proportionally increased.

As discussed above, this noise increase is not acceptable for most conventional analog signal processing circuits. In MOS imaging applications, and as a result of the conventional wisdom, an operational transconductance amplifier current mirror gain has not been conventionally implemented in a MOS imaging application advantageously.

However, in accordance with the concepts of the present invention, a current mirror stage gain factor can advantageously be implemented if selected based on the overall noise of a MOS imaging array pixel from the pixel array with which the operational transconductance amplifier will be implemented.

It is found that for most MOS imaging array pixels, the noise of the pixel, $N_p$, is dominated by reset noise, $N_R$. The operational transconductance amplifier current mirror stage gain is accordingly selected to produce an operational transconductance amplifier noise level that is less than the characteristic pixel reset noise, whereby the operational transconductance amplifier noise level makes no substantial contribution to the noise of the pixel.

In this way, the bandwidth, speed, and low-power benefits obtained from the operational transconductance amplifier gain can be provided for a MOS imaging application, while limiting the operational transconductance amplifier noise to a level that is insignificant for the MOS imaging application.

With respect to a preferred embodiment of the present invention, the overall pixel noise, $N_p$, is defined based on each noise source contribution. For clarity, only the dominating pixel reset noise, $N_R$, and the operational transconductance amplifier input stage noise, $N_I$, will be considered here. Moreover, the overall noise of the operational transconductance amplifier, $N_{OTA}$, is assumed to be dominated by the operational transconductance amplifier input stage noise, $N_I$, such that $N_I = N_{OTA}$.

Given the above parameters, the pixel noise is:

$$N_P = ((N_R) + (N_{OTA})^2)^{1/2}$$

As an example, in a preferred embodiment of the present invention, the regulation of the pixel noise is specified such that the operational transconductance amplifier noise results in no more than a 10% increase in overall pixel noise. With this given limit and based on the noise relationships discussed above, the operational transconductance amplifier noise is limited to less than about 46% of the pixel reset noise, $N_{OTA} < 0.46 N_R$.

Similarly, for a more conservative noise limit; e.g., a 5% increase in overall pixel noise, the operational transconductance amplifier noise is then limited to less than about 32% of the pixel reset noise, $N_{OTA} < 0.32 N_R$. It is noted that the concepts of the present invention can be extended to any selected noise limit, and can be extended to include other pixel noise sources and other operational transconductance amplifier noise sources.

For many MOS imaging array applications, it is found in accordance with the present invention that an increase in noise of up to about 10% is substantially unnoticeable and therefore acceptable, while an increase in noise above about 10% is typically noticeable and therefore not acceptable for many applications. It is the ability of a MOS imaging array application to accommodate a 10% noise increase without noticeable impact that aids in enablement of the operational transconductance amplifier current mirror gain factor for a MOS imaging array.

Given the selection of the operational transconductance amplifier current mirror gain factor, the gain factor is then implemented based on the rewritten operational transconductance amplifier mean-square noise expression:

$$(N_{OTA})^2 = (1/2\pi)(16/3)(kTK/C_L)$$

It is seen that for a selected operational transconductance amplifier noise limitation, the operational transconductance amplifier current mirror gain factor, K, is determined based on the operational transconductance amplifier load capacitance, $C_L$. This capacitance is set based on matching considerations and is typically greater than about, e.g., 200 fF.

The pixel-reset noise, $N_R$, is generally given as:

$$(N_R)^2 = (kT/C_{pixel})$$

where $C_{pixel}$ can be generally specified as the sense node capacitance of the pixel, and which is typically kept to a capacitance of less than about 10 fF to enhance imaging sensitivity.

Based on these relationships, the operational transconductance amplifier's current mirror gain factor can be specified to be about 3 or 4 such that the pixel noise level increase due to the operational transconductance amplifier is no more than about 10%. It is noted that the present invention does not require a particular operational transconductance amplifier's current mirror gain factor, but rather, requires its determination based on pixel noise considerations.

Turning to other aspects of the operational transconductance amplifier, it is preferable for many applications to include the bleeder current sources 22 at the current mirror stage 14 of the operational transconductance amplifier 10. Such bleeder current sources 22 drop the current mirror output current such that the current mirror gain is maintained even when the output current is reduced. This enables a further reduction in the operational transconductance amplifier's power requirements. It is noted that the concepts of the present invention do not require the bleeder current sources 22.

It is further noted that any particular operational transconductance amplifier can be implemented with the present implementation so long as the utilized operational transconductance amplifier configuration includes a current mirror stage with a current mirror gain factor that is selected based on MOS imaging array pixel noise such that the gain factor makes no significant contribution to the overall MOS imaging array pixel noise.

While various examples and embodiments of the present invention have been shown and described, it will be appreciated by those skilled in the art that the spirit and scope of the present invention are not limited to the specific description and drawings herein, but extend to various modifications and changes all as set forth in the following claims.

What is claimed is:

1. An imaging apparatus, comprising:
    an imaging array having a plurality of pixels, the pixels converting an intensity of incident light into electrical energy; and
    an operational transconductance amplifier operatively connected to said imaging array;
    said operational transconductance amplifier including a current mirror stage with a current mirror gain factor, said current mirror gain factor being selected based on a pixel noise level introduced by said imaging array such that current mirror gain factor noise introduced by said current mirror gain factor results in an overall noise level that is less than or equal to a predetermined level.

2. The imaging apparatus as claimed in claim 1, wherein the current mirror gain factor is about 3.

3. The imaging apparatus as claimed in claim 1, wherein the current mirror gain factor is about 4.

4. The imaging apparatus as claimed in claim 1, wherein the current mirror gain factor is equal to or less than 4.

5. The imaging apparatus as claimed in claim 1, wherein the noise introduced by said current mirror gain factor results in an overall noise level that is less than or equal to 110% of the pixel noise level.

6. The imaging apparatus as claimed in claim 1, wherein the noise introduced by said current mirror gain factor results in an overall noise level that is less than or equal to 105% of the pixel noise level.

7. The imaging apparatus as claimed in claim 1, wherein said operational transconductance amplifier introduces an operational transconductance amplifier noise, said operational transconductance amplifier noise including said current mirror gain factor noise, said operational transconductance amplifier noise being limited to about 46% or less of the pixel noise level.

8. The imaging apparatus as claimed in claim 1, wherein said operational transconductance amplifier introduces an operational transconductance amplifier noise, said operational transconductance amplifier noise including said current mirror gain factor noise, said operational transconductance amplifier noise being limited to about 32% or less of the pixel noise level.

9. The imaging apparatus as claimed in claim 5, wherein the pixel noise level is equal to a pixel reset noise.

10. The imaging apparatus as claimed in claim 6, wherein the pixel noise level is equal to a pixel reset noise.

11. The imaging apparatus as claimed in claim 7, wherein the pixel noise level is equal to a pixel reset noise.

12. The imaging apparatus as claimed in claim 8, wherein the pixel noise level is equal to a pixel reset noise.

13. The imaging apparatus as claimed in claim 1, wherein said imaging array is a MOS imaging array.

14. The imaging apparatus as claimed in claim 1, wherein said operational transconductance amplifier further includes bleeder current sources operatively connected to said current mirror stage.

15. The imaging apparatus as claimed in claim 1, wherein said operational transconductance amplifier further includes a cascode stage operatively connected to said current mirror stage.

16. An imaging apparatus, comprising:
    an imaging array having a plurality of pixels, the pixels converting an intensity of incident light into electrical energy;
    a correlated double sampling circuit operatively connected to said imaging array; and
    an analog to digital converter circuit operatively connected to said correlated double sampling circuit;
    said correlated double sampling circuit including an operational transconductance amplifier having a current mirror stage with a current mirror gain factor, said current mirror gain factor being selected based on a pixel noise level introduced by said imaging array such that noise introduced by said current mirror gain factor results in an overall noise level that is less than or equal to a predetermined level.

17. The imaging apparatus as claimed in claim 16, wherein the current mirror gain factor is equal to or less than 4.

18. The imaging apparatus as claimed in claim 16, wherein the noise introduced by said current mirror gain factor results in an overall noise level that is less than or equal to 110% of the pixel noise level.

19. The imaging apparatus as claimed in claim 16, wherein said operational transconductance amplifier introduces an operational transconductance amplifier noise, said operational transconductance amplifier noise including said current mirror gain factor noise, said operational transconductance amplifier noise being limited to about 46% or less of the pixel noise level.

20. The imaging apparatus as claimed in claim 16, wherein said imaging array is a MOS imaging array.

21. An imaging apparatus, comprising:
an imaging array having a plurality of pixels and a plurality of columns, each pixel converting an intensity of incident light into electrical energy, said plurality of pixels being arranged such that a predetermined number of pixels are associated with a column of said imaging array;
a plurality of correlated double sampling circuits, said plurality of correlated double sampling circuits being arranged such that each column of said imaging array is operatively connected to a correlated double sampling circuit; and
a plurality of analog to digital converter circuits, said plurality of analog to digital converter circuits being arranged such that two correlated double sampling circuits are operatively connected to one analog to digital converter circuit;
each correlated double sampling circuit including an operational transconductance amplifier having a current mirror stage with a current mirror gain factor, said current mirror gain factor being selected based on a pixel noise level introduced by said imaging array such that noise introduced by said current mirror gain factor results in an overall noise level that is less than or equal to a predetermined level.

22. The imaging apparatus as claimed in claim 21, wherein the current mirror gain factor is equal to or less than 4.

23. The imaging apparatus as claimed in claim 21, wherein the noise introduced by said current mirror gain factor results in an overall noise level that is less than or equal to 110% of the pixel noise level.

24. The imaging apparatus as claimed in claim 21, wherein said operational transconductance amplifier introduces an operational transconductance amplifier noise, said operational transconductance amplifier noise including said current mirror gain factor noise, said operational transconductance amplifier noise being limited to about 46% or less of the pixel noise level.

25. The imaging apparatus as claimed in claim 21, wherein said imaging array is a MOS imaging array.

26. An imaging apparatus, comprising:
an imaging array having a plurality of pixels and a plurality of rows, each pixel converting an intensity of incident light into electrical energy, said plurality of pixels being arranged such that a predetermined number of pixels are associated with a row of said imaging array;
a plurality of correlated double sampling circuits, said plurality of correlated double sampling circuits being arranged such that each row of said imaging array is operatively connected to a correlated double sampling circuit; and
a plurality of analog to digital converter circuits, said plurality of analog to digital converter circuits being arranged such that two correlated double sampling circuits are operatively connected to one analog to digital converter circuit;
each correlated double sampling circuit including an operational transconductance amplifier having a current mirror stage with a current mirror gain factor, said current mirror gain factor being selected based on a pixel noise level introduced by said imaging array such that noise introduced by said current mirror gain factor results in an overall noise level that is less than or equal to a predetermined level.

27. The imaging apparatus as claimed in claim 26, wherein the current mirror gain factor is equal to or less than 4.

28. The imaging apparatus as claimed in claim 26, wherein the noise introduced by said current mirror gain factor results in an overall noise level that is less than or equal to 110% of the pixel noise level.

29. The imaging apparatus as claimed in claim 26, wherein said operational transconductance amplifier introduces an operational transconductance amplifier noise, said operational transconductance amplifier noise including said current mirror gain factor noise, said operational transconductance amplifier noise being limited to about 46% or less of the pixel noise level.

30. The imaging apparatus as claimed in claim 26, wherein said imaging array is a MOS imaging array.

31. An imaging apparatus, comprising:
an imaging array having a plurality of pixels, the pixels converting an intensity of incident light into electrical energy;
a correlated double sampling circuit operatively connected to said imaging array; and
an analog to digital converter circuit operatively connected to said correlated double sampling circuit;
said analog to digital converter circuit including an operational transconductance amplifier having a current mirror stage with a current mirror gain factor, said current mirror gain factor being selected based on a pixel noise level introduced by said imaging array such that noise introduced by said current mirror gain factor results in an overall noise level that is less than or equal to a predetermined level.

32. The imaging apparatus as claimed in claim 31, wherein the current mirror gain factor is equal to or less than 4.

33. The imaging apparatus as claimed in claim 31, wherein the noise introduced by said current mirror gain factor results in an overall noise level that is less than or equal to 110% of the pixel noise level.

34. The imaging apparatus as claimed in claim 31, wherein said operational transconductance amplifier introduces an operational transconductance amplifier noise, said operational transconductance amplifier noise including said current mirror gain factor noise, said operational transconductance amplifier noise being limited to about 46% or less of the pixel noise level.

35. The imaging apparatus as claimed in claim 31, wherein said imaging array is a MOS imaging array.

* * * * *